(12) United States Patent
Rotzoll et al.

(10) Patent No.: US 10,943,946 B2
(45) Date of Patent: Mar. 9, 2021

(54) ILED DISPLAYS WITH SUBSTRATE HOLES

(71) Applicant: X Display Company Technology Limited, Dublin (IE)

(72) Inventors: Robert R. Rotzoll, Colorado Springs, CO (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/039,177

(22) Filed: Jul. 18, 2018

(65) Prior Publication Data

US 2019/0027534 A1 Jan. 24, 2019

Related U.S. Application Data

(60) Provisional application No. 62/535,307, filed on Jul. 21, 2017.

(51) Int. Cl.
*H01L 27/15* (2006.01)
*H01L 25/075* (2006.01)
(Continued)

(52) U.S. Cl.
CPC ......... *H01L 27/156* (2013.01); *G09G 3/2003* (2013.01); *G09G 3/32* (2013.01); *H01L 25/0753* (2013.01); *H04N 5/642* (2013.01)

(58) Field of Classification Search
CPC ......... H01L 27/3248; H01L 2251/5315; H01L 2251/5353; H01L 27/3246
(Continued)

(56) References Cited

U.S. PATENT DOCUMENTS

| 5,550,066 A | 8/1996 | Tang et al. |
| 6,142,358 A | 11/2000 | Cohn et al. |

(Continued)

FOREIGN PATENT DOCUMENTS

| WO | WO-2010/111601 A2 | 9/2010 |
| WO | WO-2015/193434 A2 | 12/2015 |

(Continued)

OTHER PUBLICATIONS

Bower, C. A. et al., Transfer Printing: An Approach for Massively Parallel Assembly of Microscale Devices, IEE, Electronic Components and Technology Conference, (2008).

(Continued)

*Primary Examiner* — Jonathan Han
(74) *Attorney, Agent, or Firm* — William R. Haulbrook; Michael D. Schmitt; Choate, Hall & Stewart LLP

(57) ABSTRACT

An inorganic light-emitting diode (iLED) display comprises a display substrate comprising a display area and one or more holes extending through the display substrate in the display area and a plurality of inorganic light-emitting diodes (iLEDs) disposed on, in, or over the display substrate in a regular array in the display area. At least some of the iLEDs are disposed between at least some of the holes in the display area and at least some of the holes are between at least some of the iLEDs in the display area. The display substrate can be substantially rigid and the iLED display can a flexible black sheet laminated, affixed, or adjacent to the display substrate. One or more audio loudspeakers can be disposed adjacent to the flexible sheet with the flexible sheet disposed between the display substrate and the one or more audio loudspeakers.

28 Claims, 12 Drawing Sheets

(51) Int. Cl.
*H04N 5/64* (2006.01)
*G09G 3/20* (2006.01)
*G09G 3/32* (2016.01)

(58) Field of Classification Search
USPC ....... 313/111, 501, 506; 345/55, 76, 204, 80
See application file for complete search history.

(56) References Cited

U.S. PATENT DOCUMENTS

| | | |
|---|---|---|
| 6,288,824 B1 | 9/2001 | Kastalsky |
| 6,825,559 B2 | 11/2004 | Mishra et al. |
| 6,881,946 B2 | 4/2005 | Cok et al. |
| 7,157,838 B2 | 1/2007 | Thielemans et al. |
| 7,195,733 B2 | 3/2007 | Rogers et al. |
| 7,354,801 B2 | 4/2008 | Sugiyama et al. |
| 7,394,194 B2 | 7/2008 | Cok |
| 7,408,296 B2 | 8/2008 | Cok et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,394,706 B2 | 3/2013 | Nuzzo et al. |
| 8,470,701 B2 | 6/2013 | Rogers et al. |
| 8,506,867 B2 | 8/2013 | Menard |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,889,485 B2 | 11/2014 | Bower |
| 8,941,215 B2 | 1/2015 | Hu et al. |
| 8,987,765 B2 | 3/2015 | Bibl et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,202,996 B2 | 12/2015 | Orsley et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,478,583 B2 | 10/2016 | Hu et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,590,025 B2 | 3/2017 | Yu et al. |
| 9,601,356 B2 | 3/2017 | Bower et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 9,991,163 B2 | 6/2018 | Bower et al. |
| 9,991,423 B2 | 6/2018 | Bower et al. |
| 10,050,351 B2 | 8/2018 | Bower et al. |
| 10,103,069 B2 | 10/2018 | Bower et al. |
| 10,193,025 B2 | 1/2019 | Bower et al. |
| 10,199,546 B2 | 2/2019 | Cok et al. |
| 10,209,813 B2 | 2/2019 | Yao et al. |
| 10,224,460 B2 | 3/2019 | Bower et al. |
| 10,230,048 B2 | 3/2019 | Bower et al. |
| 2001/0022564 A1 | 9/2001 | Youngquist et al. |
| 2002/0084952 A1 | 7/2002 | Morley et al. |
| 2002/0118321 A1 | 8/2002 | Ge |
| 2003/0117369 A1 | 6/2003 | Spitzer et al. |
| 2004/0080941 A1 | 4/2004 | Jiang et al. |
| 2006/0132671 A1 | 6/2006 | Koma |
| 2006/0180818 A1 | 8/2006 | Nagai et al. |
| 2012/0126229 A1 | 5/2012 | Bower |
| 2012/0314388 A1 | 12/2012 | Bower et al. |
| 2013/0141913 A1* | 6/2013 | Sachsenweger ....... H05K 3/325 362/249.02 |
| 2013/0153277 A1 | 6/2013 | Menard et al. |
| 2013/0153934 A1 | 6/2013 | Meitl et al. |
| 2013/0196474 A1 | 8/2013 | Meitl et al. |
| 2013/0221355 A1 | 8/2013 | Bower et al. |
| 2014/0159043 A1 | 6/2014 | Sakariya et al. |
| 2014/0225938 A1 | 8/2014 | Soni et al. |
| 2014/0264763 A1 | 9/2014 | Meitl et al. |
| 2015/0084054 A1 | 3/2015 | Fan et al. |
| 2015/0098188 A1* | 4/2015 | Cox ......................... G09F 9/33 361/690 |
| 2015/0135525 A1 | 5/2015 | Bower |
| 2015/0263256 A1 | 9/2015 | Hsieh et al. |
| 2015/0279822 A1 | 10/2015 | Hsu |
| 2015/0301781 A1* | 10/2015 | Ekkaia ................. G06F 3/1446 362/237 |
| 2015/0327388 A1 | 11/2015 | Menard et al. |
| 2015/0362165 A1 | 12/2015 | Chu et al. |
| 2015/0371585 A1* | 12/2015 | Bower .................... H01L 33/38 345/1.1 |
| 2015/0371974 A1 | 12/2015 | Bower et al. |
| 2016/0004123 A1 | 1/2016 | Tanabe |
| 2016/0064363 A1* | 3/2016 | Bower .................. H01L 25/167 315/294 |
| 2016/0093600 A1 | 3/2016 | Bower et al. |
| 2016/0210895 A1 | 7/2016 | Fan et al. |
| 2016/0260388 A1 | 9/2016 | Yata et al. |
| 2016/0267836 A1* | 9/2016 | Meersman ............... G09G 3/32 |
| 2016/0309246 A1* | 10/2016 | O'Keeffe ................. H04W 4/70 |
| 2017/0010706 A1 | 1/2017 | Cok |
| 2017/0025395 A1 | 1/2017 | Chen et al. |
| 2017/0061842 A1 | 3/2017 | Cok et al. |
| 2017/0133818 A1 | 5/2017 | Cok |
| 2017/0148771 A1 | 5/2017 | Cha et al. |
| 2017/0338374 A1 | 11/2017 | Zou et al. |
| 2018/0007750 A1 | 1/2018 | Meitl et al. |
| 2018/0175248 A1 | 6/2018 | Ahmed |
| 2018/0366450 A1 | 12/2018 | Gardner et al. |
| 2019/0088630 A1 | 3/2019 | Cok et al. |

FOREIGN PATENT DOCUMENTS

| | | |
|---|---|---|
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

(56) References Cited

OTHER PUBLICATIONS

Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructural elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).
Bower, C. A. et al., Micro-Transfer-Printing: Heterogeneous Integration of Microscale Semiconductor Devices using Elastomer Stamps, 2014 IEEE SENSORS, 3 pages and 1 page IEEE Xplore abstract, date of conference: Nov. 2-5, 2014.

* cited by examiner

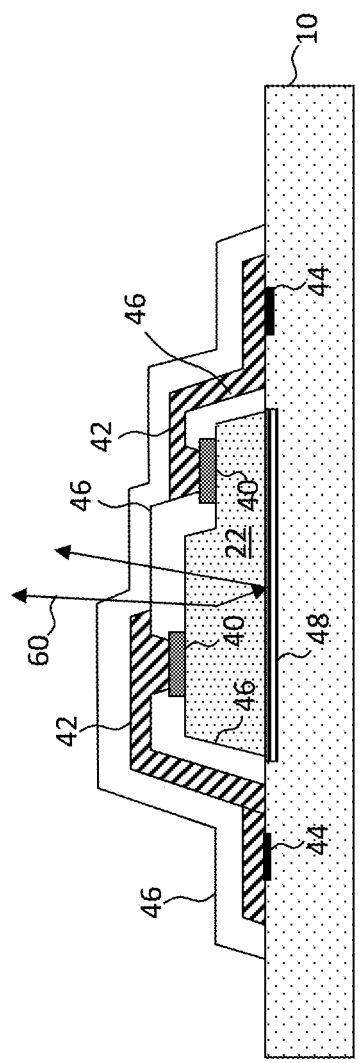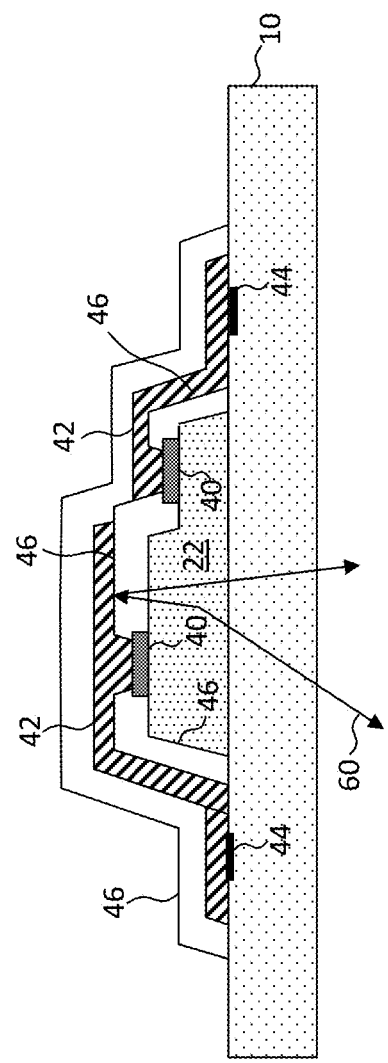

ILED DISPLAYS WITH SUBSTRATE HOLES

PRIORITY APPLICATION

This application claims the benefit of U.S. Provisional Patent Application No. 62/535,307, filed on Jul. 21, 2017, entitled Micro-iLED Displays with Substrate Holes, the disclosure of which is incorporated by reference herein in its entirety.

CROSS REFERENCE TO RELATED APPLICATION

Reference is made to U.S. patent application Ser. No. 14/754,573 filed May 21, 2015, titled Small-Aperture-Ratio Display with Electrical Component, the disclosure of which is incorporated by reference herein in its entirety.

TECHNICAL FIELD

The present invention relates generally to direct-view inorganic iLED displays having a small aperture ratio.

BACKGROUND

Flat-panel direct-view displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal (LC) displays employ liquid crystals to block or transmit light from a backlight behind the liquid crystals and organic light-emitting diode (OLED) displays rely on passing current through a layer of organic material that glows in response to the current. Alternatively, front- or rear-projection display technologies project images onto a reflective or transmissive display screen, respectively. Inorganic light-emitting diodes (iLEDs) can also be used in displays, including very large displays. For example a 10.3 meter 4k-resolution iLED display has been commercially installed in a cinema by Samsung, although conventional movie theater screens tend to be at least 13 meters in size.

Most direct-view flat-panel displays use either passive-matrix (PM) control employing electronic circuitry external to the display substrate or active-matrix (AM) control employing electronic circuitry formed directly on the display substrate and associated with each light-emitting element. Both OLED and LC displays using both passive-matrix control and active-matrix control are commercially available. An example of such an AMOLED display device is disclosed in U.S. Pat. No. 5,550,066.

Typical systems for both direct-view and projected displays include audio equipment for emitting sound; generally, the sound emitted corresponds to the displayed images, for example a sound track that accompanies a video stream, such as a film. The audio equipment is usually provided separately from the display, for example on the sides, beneath, above, or remotely from the display. In theaters, audio loudspeakers are additionally located behind a reflective display screen, which contributes to the verisimilitude of the audio-visual experience by locating the source of sound more closely to the images from which the sound purportedly comes. However, the display substrate in direct-view displays interferes with sound from audio loudspeakers located behind the display substrate, inhibiting the use of such direct-view displays in theaters.

The amount of light emitted from a liquid crystal display is determined by the brightness of the backlight, the transmissivity of the liquid crystals, and the pixel area of the display through which light is emitted (the fill factor or aperture ratio). A larger pixel area for a given display will transmit more light than a smaller pixel area for the same display. Hence, in order to achieve a desirably bright LCD, the pixels are preferably large. For an OLED display, the brightness depends on the current density passed through the OLED pixels. At higher current densities, brightness is increased and lifetime is decreased. Thus, a larger light-emitting OLED pixel area will increase the lifetime of an OLED display by reducing the current density. It is therefore also preferred that OLED pixels are large. Thus, for conventional direct-view flat-panel displays, such as liquid crystal (LC) or organic light-emitting diode (OLED) displays, a larger aperture ratio typically results in a longer lifetime, a greater maximum brightness, or both longer lifetime and greater maximum brightness for a flat-panel direct-view display, inhibiting the inclusion of other features or functions on the display substrate.

Inorganic light-emitting diode displays using micro-LEDs (for example having an area less than 1 mm square, less than 100 microns square, or less than 50 microns square or having an area small enough that it is not visible to an unaided observer of the display at a designed viewing distance) are also known. For example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate.

Tiled displays are used to make displays that are larger than can be made on a single substrate. For example, U.S. Pat. Nos. 6,881,946, 7,394,194, 7,408,296, and 9,590,025 disclose various direct-view tiled displays. U.S. Patent Application Publication No. 2002/0118321 discloses a tiled LCD display. In 2017, Sony Corporation demonstrated a 32 feet by 9 feet tiled iLED display with 16-inch by 18-inch modules (the Sony Canvas).

Flat-panel displays consume energy and produce heat. Some display designs incorporate features for cooling the display with either active or passive structures. U.S. Pat. No. 7,157,838 discloses an electroluminescent display on a substrate with drive circuitry and a cooling channel defined behind the substrate adjacent to the drive circuitry.

There remains a need for display systems, structures, and methods of manufacturing that provide increased lifetime, brightness, image quality, ease of manufacturing, reduced cost and improved functionality and utility in simpler and more robust structures and for more applications.

SUMMARY

According to certain embodiments of the present invention, an inorganic light emitter such as a micro inorganic light-emitting diode (micro-iLED) provides high-brightness light (for example, having an efficiency or brightness greater than incandescent, fluorescent, or OLED light emitters) output without requiring relatively large light-controlling pixel areas or organic materials, and without restrictions on viewing angle. Light emitters formed in a crystalline semiconductor wafer using conventional materials and processes can be micro-transfer printed to a display substrate at a relatively low cost and with excellent efficiency. Therefore, among other things, certain embodiments of the present invention provide increased lifetime, image quality, ease of manufacturing, and reduced cost and improved functionality and utility in a simpler and more robust display structure for a variety of applications. Micro-iLEDs printed onto a display substrate, for example, using micro-transfer printing occupy relatively little area on the display substrate, providing space to construct or otherwise provide additional structures, circuits, or devices on the display substrate, such as holes to allow sound to pass through the display substrate. Certain embodiments of the present invention enable a direct-view display with audio speakers located behind the display substrate and improved audio sound reproduction to a viewer and listener in front of the display as well as improved cooling and reduced weight.

According to certain embodiments of the present invention, an inorganic light-emitting diode (iLED) display comprises a display substrate having a display area and a shape defining one or more holes extending through the display substrate in the display area. A plurality of inorganic light-emitting diodes (iLEDs) are disposed on, in, or over the display substrate in a regular array in the display area. At least some of the iLEDs are disposed between at least some of the one or more holes in the display area and at least some of the one or more holes are between at least some of the iLEDs in the display area.

In some embodiments, the iLED display comprises a plurality of tiles, each tile comprising a display substrate comprising a display area and one or more holes extending through the display substrate in the display area of the tile. At least some of the iLEDs are disposed between at least some of the one or more holes in the display area of the tile and at least some of the one or more holes are between at least some of the iLEDs in the display area of the tile.

In some embodiments, the iLEDs emit light through the display substrate. In some embodiments, the iLEDs emit light in a direction away from the display substrate.

In some embodiments, the one or more holes are at least partially unfilled. In some embodiments, the display comprises foam disposed in the one or more holes (e.g., the one or more holes are at least partially filled with foam), for example a substantially black foam.

In some embodiments, one or more audio loudspeakers are disposed adjacent to the display substrate and configured to emit sound through the one or more holes in the display substrate. The display substrate can be substantially rigid and the iLED display can comprise a flexible sheet, such as a substantially black sheet, laminated, affixed, or adjacent to the display substrate. The one or more audio loudspeakers can be disposed adjacent to the flexible sheet with the flexible sheet disposed between the display substrate and the one or more audio loudspeakers.

In some embodiments of the present invention, the plurality of iLEDs on the display substrate define a minimum contiguous convex display area of the display substrate that includes all of the iLEDs and the combined area of the iLEDs is less than or equal to 25%, 10%, 5%, 2%, 1%, 0.5%, 0.1%, 0.05%, or 0.01% of the minimum contiguous convex display area. The one or more holes can cover more than or equal to 25%, 12.5%, 10%, 5%, 2%, or 1% of the minimum contiguous convex display area.

In some embodiments, the iLED display comprises two or more electrical conductors disposed on or over the display substrate and between the one or more holes in the display area, each iLED electrically connected to two or more electrical conductors.

In some embodiments, the iLED display is a matrix-addressed display having row-select and column-data lines, and each iLED is controlled by a row-select line in combination with a column-data line. In some embodiments, the iLED display is an active-matrix display and a controller, for example a pixel controller, is disposed in, on, or over the display substrate in the display area in association with one or more iLEDs and electrically connected to the one or more iLEDs to control the one or more iLEDs using select and data signals provided by the row-select line and column-data line, respectively.

In certain embodiments, light-emitting diodes are organized into pixels and the plurality of pixels forms a regular array on the display substrate or are irregularly or randomly arranged. The light-emitting diodes can be inorganic light-emitting diodes (iLEDs) or micro-inorganic-light-emitting diodes (micro-iLEDs). Each pixel can comprise one or more iLEDs. In certain embodiments, each pixel includes a single light emitter. In certain embodiments, each pixel includes at least three light emitters, each of the at least three light emitters emitting light of different colors. In some embodiments, the one or more light emitters are disposed on a display substrate. In some embodiments, the one or more light emitters are disposed on a pixel substrate and each pixel substrate is disposed on the display substrate. Each pixel substrate can comprise a broken or separated tether as a consequence of micro-transfer printing the pixel substrate. In some embodiments, each iLED of the plurality of iLEDs comprises a broken or separated tether as a consequence of micro-transfer printing the iLEDs.

In certain embodiments of the present invention, each iLED of the plurality of iLEDs has at least one of a width from 2 to 50 μm (e.g., 2 to 5 μm, 5 to 10 μm, 10 to 20 μm, or 20 to 50 μm), a length from 2 to 50 μm (e.g., 2 to 5 μm, 5 to 10 μm, 10 to 20 μm, or 20 to 50 μm), and a thickness from 2 to 50 μm (e.g., 2 to 5 μm, 5 to 10 μm, 10 to 20 μm, or 20 to 50 μm).

In some embodiments of the present invention, the iLED display comprises a plurality of holes between adjacent iLEDs of the plurality of iLEDs, between adjacent pixels, or within an area bounded by pixels that does not include any other pixels, in one or two dimensions parallel to a surface of the display substrate.

In certain embodiments, the one or more light emitters are formed in or on or located on the display substrate. In certain embodiments, each light emitter is formed in or on or disposed on a pixel substrate separate from the display substrate. In certain embodiments, each pixel includes a pixel substrate and the display includes a plurality of pixel substrates disposed on the display substrate. A single iLED, or multiple iLEDs can be disposed on each pixel substrate. In some embodiments, multiple pixels share a common pixel substrate.

In certain embodiments, each pixel includes a pixel controller and the pixel controller is electrically connected to the one or more light emitters in the pixel to control the light output by the one or more light emitters. In some embodiments, the pixel controller is located on the display substrate. In other embodiments, a pixel includes a pixel substrate separate from the display substrate and the pixel controller is located on the pixel substrate.

In certain embodiments, one or more electrical conductors such as conductive wires electrically connect two or more of the pixels in the display area. In certain embodiments, the one or more electrical conductors conduct signals for controlling the pixels, for conducting power to the pixels, or for providing a ground reference voltage.

In certain embodiments, the combined light-emissive areas of the light emitters or the combined areas of the light emitters is less than or equal to one eighth, one tenth, one twentieth, one fiftieth, one hundredth, one five-hundredth, one thousandth, one two-thousandth, or one ten-thousandth of the minimum contiguous convex display substrate area.

In certain embodiments, the display substrate is at least one of plastic, glass, and sapphire. In certain embodiments, the display substrate is transparent to visible light. In certain embodiments, the display substrate is at least partially transparent to visible light. In certain embodiments, the iLED display has no less than 30 percent transparency to visible light (e.g., no less than 50%, 80%, 90%, or 95% transparency to visible light).

In certain embodiments, each pixel includes: a printed pixel of a plurality of printed pixels disposed on the display substrate, each printed pixel of the plurality of printed pixels including: a pixel substrate of a plurality of pixel substrates on which the micro inorganic light-emitting diodes for a respective pixel are disposed, and a fine interconnection having a width of 100 nm to 1 μm electrically connected to the micro inorganic light-emitting diodes for the respective pixel.

In certain embodiments, the display substrate includes one or more crude lithography interconnections having a width from 2 μm to 2 mm, wherein each crude lithography interconnection is electrically connected to at least one of the plurality of pixels on the display substrate. The crude lithography interconnections can be disposed at least partly or entirely on the display substrate.

In certain embodiments, the plurality of light emitters includes a plurality of yellow printed micro inorganic light-emitting diodes that emit yellow light, and wherein each pixel of the plurality of pixels includes a yellow printed micro inorganic light-emitting diode of the plurality of yellow printed micro inorganic light-emitting diodes that emit yellow light.

The disclosed technology includes a method of micro assembling an inorganic light-emitting diode (iLED) display, the method including: forming a plurality of printable inorganic micro LEDs on one or more native source wafers; and micro transfer printing the plurality of printable micro-iLEDs onto a non-native substrate to form one or more pixels. One or more printable micro-iLEDs can be micro-transfer printed onto a non-native pixel substrate to form a pixel and the pixels can be micro-transfer printed onto a non-native display substrate. Alternatively, a plurality of printable micro-iLEDs can be micro-transfer printed onto a non-native display substrate to form a plurality of pixels on the display substrate.

The plurality of micro-transfer printable micro inorganic LEDs can include: one or more red printed micro inorganic light-emitting diodes that emit red light; one or more green printed micro inorganic light-emitting diodes that emit green light; and one or more blue printed micro inorganic light-emitting diodes that emit blue light. Each pixel can include a red printed micro inorganic light-emitting diode of the plurality of red printed micro inorganic light-emitting diodes, a green printed micro inorganic light-emitting diode of the plurality of green printed micro inorganic light-emitting diodes, and a blue printed micro inorganic light-emitting diode of the plurality of blue printed micro inorganic light-emitting diodes.

In certain embodiments, all of the pixels are substantially identical.

In some embodiments, the display substrate is a tile substrate.

In some embodiments, an inorganic light-emitting diode (iLED) display comprises a plurality of tile substrates disposed in a common plane or on a common surface, each tile substrate of the plurality of tile substrates comprising a display area and one or more tile substrate edges, and wherein a tile substrate edge of each tile substrate is disposed adjacent to a tile substrate edge of another tile substrate; a plurality of inorganic light-emitting diodes (iLEDs) disposed on, in, or over each tile substrate of the plurality of tile substrates in an array in the display area; and at least one tile substrate of the plurality of tile substrates has a shape that defines one or more holes extending through the at least one tile substrate at the adjacent tile substrate edge of the at least one tile substrate of the plurality of tile substrates.

In some embodiments, two adjacent tile substrates of the plurality of tile substrates having adjacent display substrate edges each have shape that defines at least one hole extending through the tile substrate at the display substrate edge and wherein at least one of the at least one hole of each of the adjacent tile substrates overlap to form a larger hole. In some embodiments, the array is a regular array.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 12A and 12B are illustrative cross sections of horizontal LEDs, according to illustrative embodiments of the present invention.

Figure 1:
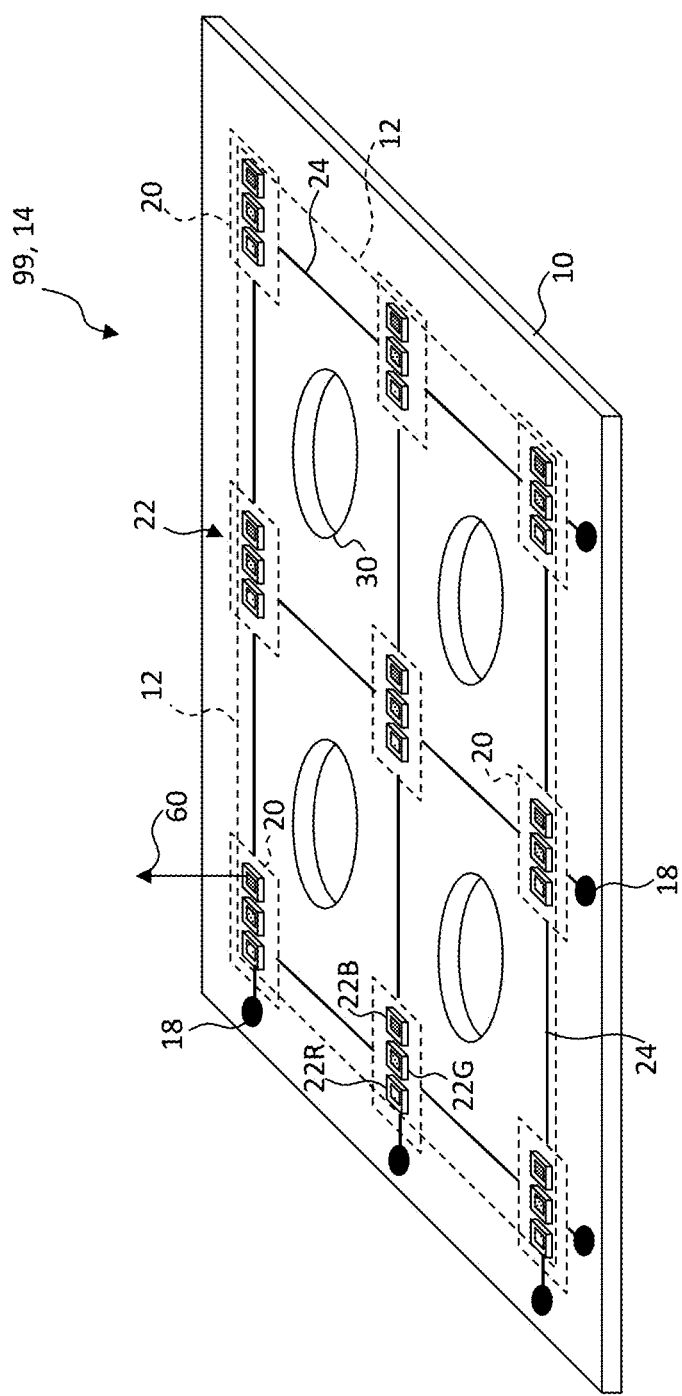
FIGS. 1 and 2 are perspective illustrations of displays/tiles according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present invention comprise a direct-view flat-panel display 99 provided on a display substrate 10 that incorporates holes 30 in the display substrate 10. A display substrate 10 can be a tile substrate 16 in a tiled display. As used herein, a substrate (e.g., a display substrate 10 or tile substrate 16) that "incorporates" one or more holes 30 (or is alternatively described as "having" or "comprising" one or more holes 30) is a substrate that has a shape that defines one or more holes. Holes 30 can allow air movement through a display 99 and enable audio devices such as audio loudspeakers 36 to be located behind the display 99 with respect to a display viewer and provide sound transmission through the holes 30 and improved audio reproduction for the display viewer. In certain embodiments, holes also improve display cooling by improving airflow over and through a display substrate 10. Holes 30 can reduce the overall extent or size of a display system 99 by locating the audio devices (loudspeakers or microphones) behind the display. Holes in a display system 99 can also reduce the wind resistance of the display system when located outdoors and exposed to wind, as well as reduce weight. A reduced weight is helpful when mounting large number of tiles in a frame, for example a vertical frame.

Figure 6:
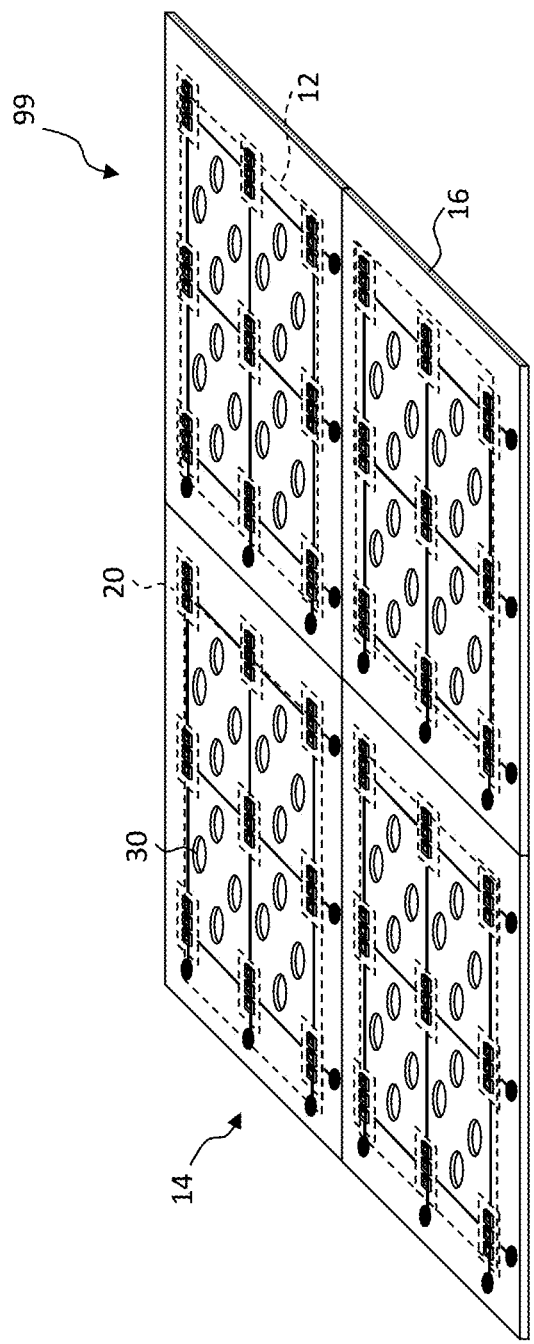
FIG. 6 is a perspective illustration of a displays made of tiles according to illustrative embodiments of the present invention.

Referring to the perspective of FIG. 1, an inorganic light-emitting diode (iLED) display 99 comprises a display substrate 10 comprising a display area 12 and one or more holes 30 extending through the display substrate 10 in the display area 12. Holes 30 can be located in a regular array, or not. Holes 30 can have circular, round, oval, polygonal (e.g., square or hexagonal) or similar cross section and can be regular or irregular. A plurality of inorganic light-emitting diodes (iLEDs) 22 are disposed on, in, or over the display substrate 10 in an array in the display area 12 and groups of iLEDs 22 can be arranged in pixels 20 in the display area 12 of the display substrate 10. As used herein, a display area 12 is the minimum contiguous area over a display substrate 10 that is the smallest area that includes all of the iLEDs 22 in pixels 20 in a convex shape, such as a polygon with no concave external angles (mathematically, such an area is a convex hull). In certain embodiments, an array is a regular array. As used herein, a regular array is a two-dimensional array in which pixels 20 are separated by a common pixel pitch in each dimension in the array. Different rows or columns of pixels 20 in a regular array can have different spatial phases or are offset with respect to each other. In certain embodiments, the iLED display 99 of FIG. 1 is used as a tile 14 in a larger tiled display so that each display substrate 10 is a tile substrate 16 (e.g., as shown in FIG. 6).

In various embodiments of the present invention, at least some of the iLEDs 22 or pixels 20 are located between adjacent holes 30 in the display area 12 of a display substrate 10 in one or two dimensions parallel to a surface of the display substrate 10. In certain embodiments, at least some of the iLEDs 22 or pixels 20 are electrically connected to power, ground, and control signals provided on electrical conductors 24. At least some of the holes 30 can be located between at least some of the iLEDs 22 or adjacent pixels 20 in a display area 12 of a display substrate 10 so that the holes 30 and iLEDs 22 or pixels 20 are interspersed in the display area 12 of the display substrate 10. In some embodiments (such as the illustrative embodiment shown in FIG. 2), an iLED display 99 comprises a plurality of holes 30 between adjacent iLEDs 22 or adjacent pixels 20 of a plurality of iLEDs 22 in one or two dimensions parallel to a surface of a display substrate 10. As used herein, two iLEDs 22 are adjacent if no other iLEDs 22 are between the adjacent iLEDs 22; two pixels 20 are adjacent if no other pixels 20 are between the adjacent pixels 20; and two holes 30 are adjacent if no other holes 30 are between the adjacent holes 30. On a two-dimensional surface such as a surface of a display substrate 10 or tile substrate 16, a pixel 20 or hole 30 can be adjacent to multiple pixels 20 or holes 30, respectively, if no other pixels 20 or holes 30 are enclosed within a convex hull surrounding the adjacent pixels 20 or holes 30. As used herein, an iLED 22 or hole 30 is between two other objects if a line segment that intersects the two other objects also intersects the iLED 22 or hole 30. Additionally, an iLED 22 or hole 30 is between three or more other objects if a convex hull that encloses the three other objects also encloses at least a portion of the iLED 22 or hole 30.

In some embodiments, iLEDs 22 are matrix addressed and controlled through two or more electrical conductors 24, for example electrical conductors 24 that can be row-select lines and column-data lines. The two or more electrical conductors 24 can be disposed on or over a display substrate 10 and between at least some of the holes 30, for example in a substantially rectilinear array at least partially in the display area 12 of the display substrate 10. Alternatively, electrical conductors 24 can be routed around holes 30 in a display area 12.

In some embodiments of the present invention, iLEDs 22 can emit light 60 in a direction opposite to or away from a display substrate 10 so that most or all of the light emitted does not pass or is not transmitted through the display substrate 10 (in a top-emitter configuration). Referring to FIG. 12A, a micro-transfer printed horizontal LED structure comprises an iLED 22 micro-transfer printed on or over a reflective layer 48 on a display substrate 10. Each iLED 22 has two or more iLED contact pads 40 exposed through patterned protective transparent dielectric structures 46 and electrically connected to display substrate contact pads 44 on the display substrate 10 with electrodes 42. Light 60 is emitted from the top side of the iLED 22 when electrical current is provided through the display substrate contact pads 44, electrodes 42, and iLED contact pads 40. U.S. Pat. No. 6,825,559 describes methods of making micro-transfer-printable iLEDs 22 useful in making certain embodiments disclosed herein.

Figure 2:
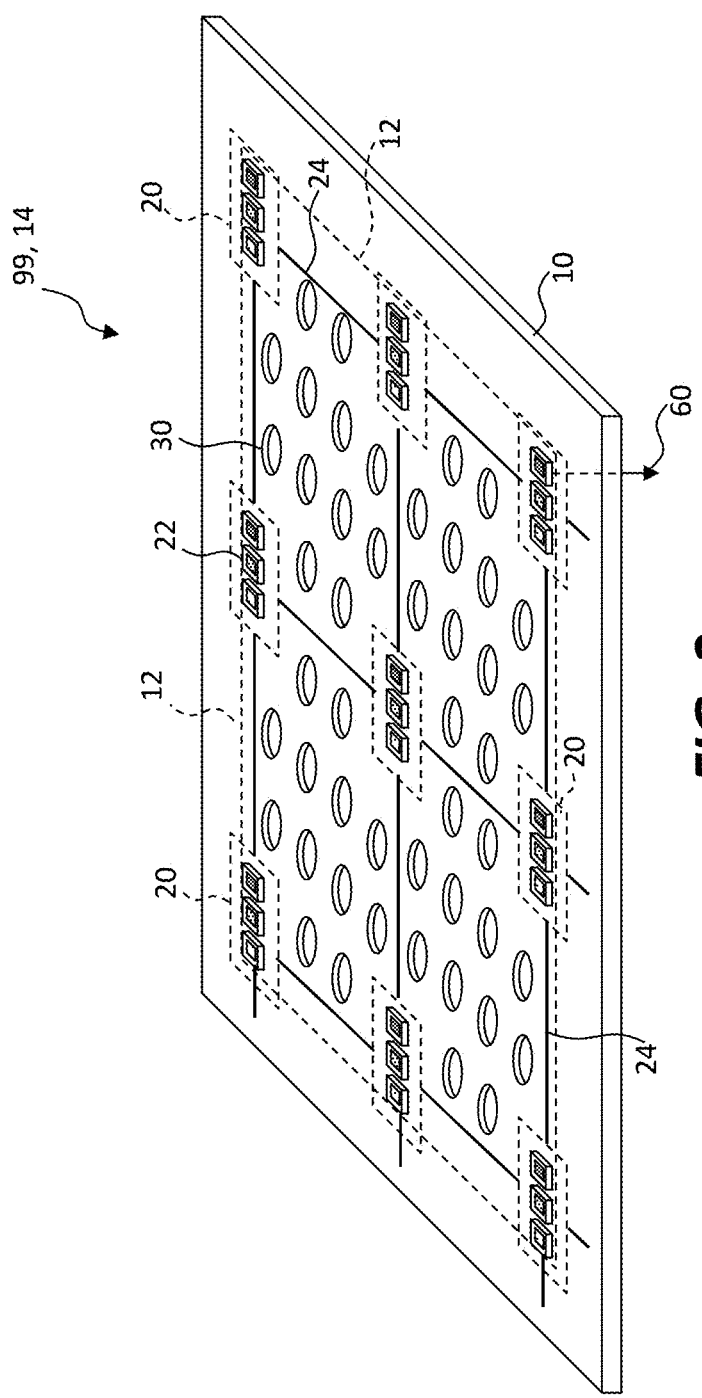

As shown in the perspective of FIG. 2, a plurality of holes 30 can be located between iLEDs 22 or pixels 20, or within a portion of a display area 12 of a display substrate 10 bounded by pixels 20 that does not include any pixels 20, in one or both dimensions (x and y) over and in a direction parallel to the display substrate 10 in the display area 12. By having more and smaller holes 30 in a display substrate 10, the rigidity or mechanical strength, or robustness of an iLED display 99 can be improved. As is also illustrated in FIG. 2, light 60 can be emitted from the iLEDs 22 through the display substrate 10 (in a bottom-emitter configuration), in contrast to the top-emitter embodiments shown in FIG. 1. The illustrative embodiments shown in FIG. 1 and FIG. 2 can be modified to be either top-emitter or bottom-emitter iLED displays 99. Referring to FIG. 12B, a micro-transfer printed iLED structure comprises an iLED 22 micro-transfer printed on the display substrate 10. Each iLED 22 has two or more iLED contact pads 40 exposed through protective dielectric structures 46 and electrically connected to display substrate contact pads 44 on the display substrate 10 with reflective electrodes 42. Light 60 is emitted from the bottom side of the iLED 22 through the display substrate 10 when electrical current is provided through the display substrate contact pads 44, electrodes 42, and iLED contact pads 40.

Figure 3:
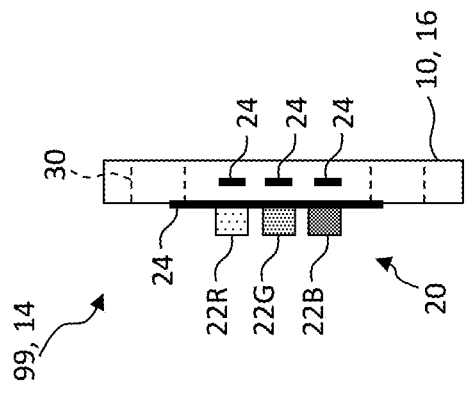
FIG. 3 is a schematic of a pixel, according to illustrative embodiments of the present invention.

Referring also to the plan view illustration of FIG. 3, iLEDs 22 can be organized and controlled in groups of pixels 20, each of which comprises one or more iLEDs 22. The iLEDs 22 in a pixel 20 can include iLEDs 22 that emit different colors of light, for example red light from a red-light emitter 22R, green light from a green-light emitter 22G, and blue light from a blue-light emitter 22B (collectively iLEDs 22). As shown in the exemplary embodiments of FIGS. 1-3, pixels 20 and iLEDs 22 in pixels 20 can be electrically controlled to emit light 60 using electrical conductors 24, for example row-select conductors 24 and column-data conductors 24 in a matrix-addressed control scheme for the pixels 20. In certain embodiments, conductors 24 are provided in two metal layers on or in a display substrate 10 to avoid electrical short circuits and can be electrically connected to display substrate contact pads 44 (e.g., as shown in FIGS. 12A, 12B). Other electrical connections suitable for connecting to display control circuits (not shown) can be used. For example, in certain embodiments, conductors are provided in a single metal layer and jumpers are used to provide complete electrical connections without causing electrical shorts. In some embodiments, row- or column-control circuits can be provided on a display substrate 10, for example around the periphery of the display substrate 10 and external to the display area 12 (as discussed further with respect to FIG. 5 below).

Figure 4:
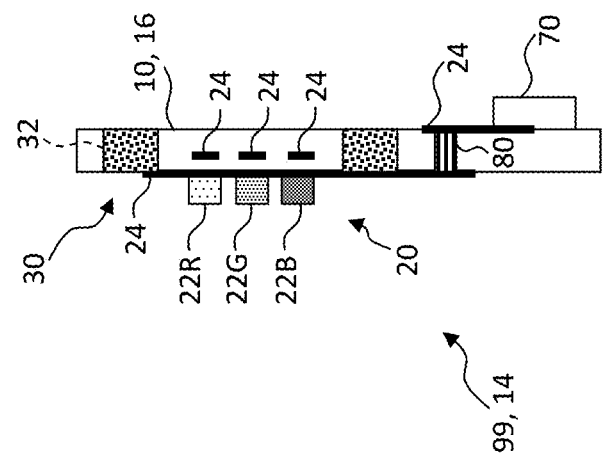
FIGS. 4 and 5 are cross sections of displays/tiles, according to illustrative embodiments of the present invention.

FIG. 4 illustrates a partial cross section of an iLED display 99 across a horizontal conductor 24 with pixel 20 iLEDs 22, conductors 24 (in two layers) and holes 30 (indicated with dashed lines) on a display substrate 10. The holes 30 can form a regular array in the minimum contiguous convex display area 12. Alternatively, the holes 30 can be located in a random arrangement. According to some embodiments of the present invention, air can flow through holes 30 in a display substrate 10 to cool micro-iLEDs 22. Holes 30 in an iLED display 99 can improve utilization of various cooling schemes for the associated viewing space as well as the iLED display 99. For example, forcing air in either direction through a display substrate 10 from the rear (a side of the display substrate 10 opposite a viewer of the iLED display 99) would improve cooling of display-related components behind the iLED display 99. Holes 30 can also be used to allow at least some of the air in a room to flow through an iLED display 99, thereby reducing the iLED display 99 impact on existing air conditioning and heating systems in a given room in which the iLED display 99 is placed. In contrast, a typical illuminating display of the prior art completely blocks flow in a direction normal to a surface of its display substrate.

In some applications of certain embodiments of the present invention, an iLED display 99 is placed in a dark room to improve the contrast of the iLED display 99, for example a theater. In other applications of certain embodiments of the present invention, an iLED display 99 is placed in a location with significant and noticeable ambient light, for example a commercial advertising venue, either indoor or outdoor. In either case, it can be helpful for the iLED display 99 to be relatively bright to observers. Since micro-iLEDs 22 are never perfectly efficient, they will generate heat in addition to light and cooling supplied to the micro-iLEDs 22 can improve their performance and lifetime. Cooling can be supplied, for example, by providing airflow over micro-LEDs 22 and through holes 30.

In certain embodiments, and as shown in the illustrative embodiments of FIGS. 1-4, holes 30 are at least partially unfilled (e.g., are completely and entirely empty). In some embodiments, referring to FIG. 5, holes 30 are at least partially filled with a foam 32. As used herein, a foam 32 is a material comprising both a solid and a gas, such as air. Foam 32 can comprise more than 50%, 70%, 80, or 90% gas. The solid can be flexible, for example a flexible plastic, can be substantially light-absorbing or black, for example absorbing more than or equal to 50%, 60%, 70%, 80%, 90%, or 95% of incident visible light, and can be either closed-cell or open-cell. Foam 32 can be a foam rubber or analogous material, for example the foam earpieces found on headphones or ear buds. Foam 32 can be flexible and can be designed to efficiently transmit sound.

Figure 5:
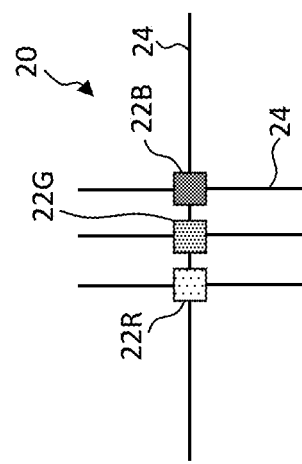

FIG. 5 also illustrates a micro-control structure for rows or columns of pixels 20 on a display substrate 10. As shown in FIG. 5, a row- or column-control circuit 70 is disposed on a side of the display substrate 10 opposite the iLEDs 22 (on the other side of display substrate 10 from the iLEDs 22). The row- or column-control circuit 70 can control rows or columns of pixels 20, for example by providing row-select signals or column-data signals to the pixels 20 or iLEDs 22 in the iLED display 99 through conductors 24, for example in a passive-matrix control scheme for the iLED display 99. The row- or column-control circuit 70 can be electrically connected to the iLEDs 22 through vias 80, for example vias 80 filled with an electrically conductive material. As the row- or column-control circuit 70 is disposed on the opposite side of the display substrate 10, it can be located within the display area 12 in a top-emitter configuration (corresponding to FIG. 1, not shown in FIG. 5).

In some embodiments of the present invention, and as shown in FIG. 6, an iLED display 99 is a tiled iLED display 99 comprising a plurality of tiles 14 each comprising a tile substrate 16. A tile substrate 16 can be a display substrate 10 or a display substrate 10 can be a tile substrate 16. Each tile substrate 16 comprises one or more holes 30 extending through the tile substrate 16 in the display area 12. The display area 12 can also include all of the iLEDs 22 on all of the tile substrates 16 of the iLED display 99. iLEDs 22 are distributed over the tile substrate 16 between holes 30 and holes 30 are distributed between the iLEDs 22 or pixels 20 of the display area 12. In certain embodiments, each tile 14 is managed as a separate display with tile control circuits controlling each tile 14 under the supervision of a display controller or the tiles 14 can be electrically connected to form larger arrays of pixels 20 that are controlled as a larger group by a display controller.

Figure 13:
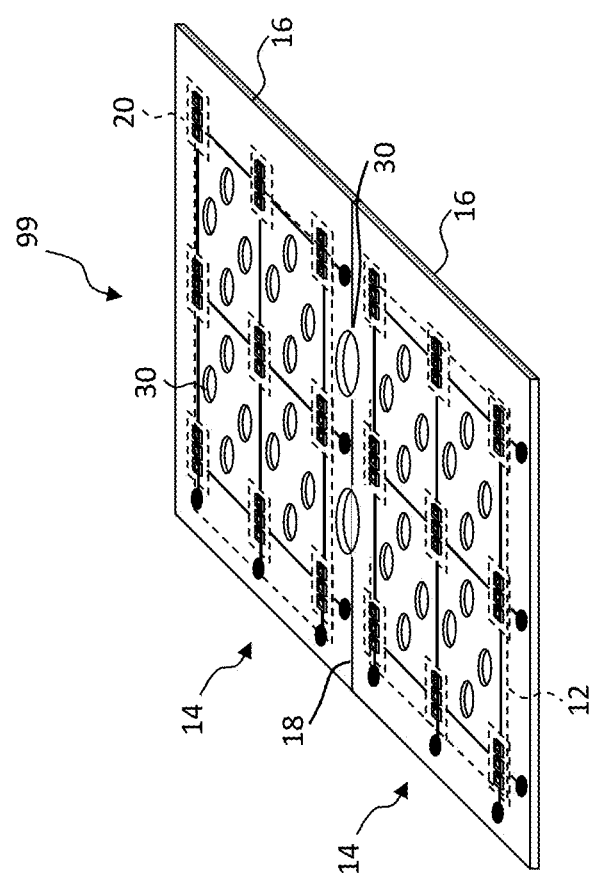
FIG. 13 is a perspective illustration of a display, according to illustrative embodiments of the present invention.

A tile structure can correspond to a display structure. Thus, the illustrations of FIGS. 1, 2, 4, and 5 can also refer to tiles 14. Display substrates 10 can be tile substrates 16, each having an array of pixels 20 and iLEDs 22, and can include a row- or column-control circuit 70 for each tile 14. The tiles 14 can be under the control of a display controller providing display signals to the row- or column-control circuits 70 for each tile 14. In particular, for a top-emitter configuration, a display controller and printed circuit board for mounting the tiles 14 can be provided and connected to the tiles 14 on the side of the tiles 14 opposite the iLEDs 22. In some embodiments of the present invention, holes 30 are located between or on the edges 18 of tile substrates 16. In this context, a hole 30 can be a notch or other indentation in the tile substrate 16 that extends through the tile substrate 16. In some embodiments, corresponding semicircular or rectangular holes 30 can be located on adjacent tile substrate edges 18 to form a larger hole 30 (as shown in FIG. 13).

Figure 7:
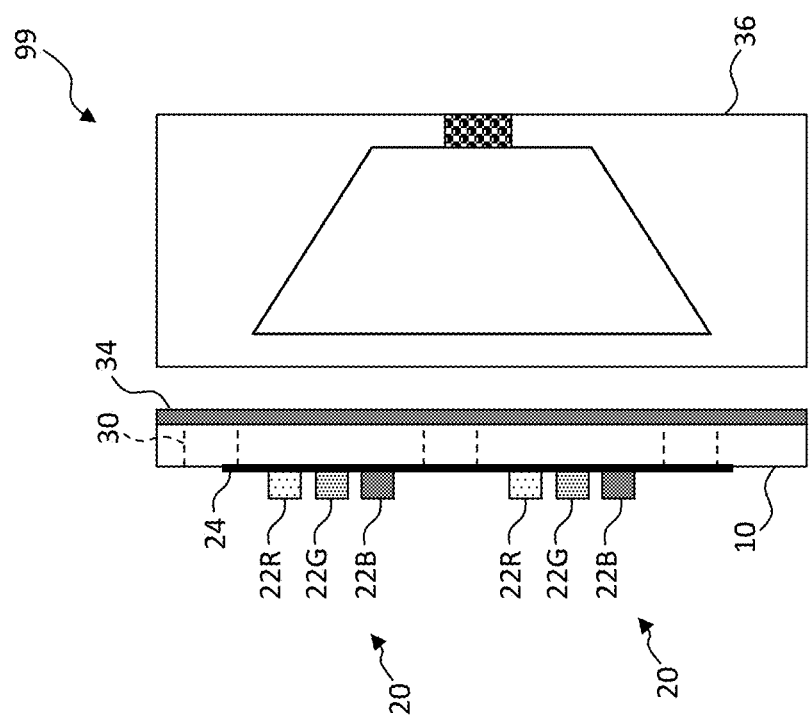
FIG. 7 is a cross section of a display, according to illustrative embodiments of the present invention.

Referring to FIG. 7, in some embodiments of the present invention, an iLED display 99 comprises one or more audio loudspeakers 36 (e.g., an electro-acoustic transducer that converts electrical audio signals into sound) disposed adjacent to a display substrate 10 and configured to emit sound through holes 30 in the display substrate 10 (or tile substrates 16). In this way, the sound for a video sequence displayed by the array of pixels 20 can appear to more closely originate from the images displayed in the video sequence, improving the verisimilitude of an audio-visual experience. This is particularly useful for theater settings in which the display screens are relatively large, for example greater than or equal to two, five, ten, fifteen, twenty, or fifty meters in diagonal, and for large audiences, for example greater than or equal to two, five, ten, or twenty-five people.

In some embodiments of the present invention, a display substrate 10 is substantially rigid and an iLED display 99 comprises a flexible sheet 34 laminated or affixed to the display substrate 10, or the flexible sheet 34 is disposed adjacent to the display substrate 10. By substantially rigid is meant that the display substrate 10 does not derive any benefit from being flexed, is not intentionally flexed, or that the display substrate 10 does not intentionally transmit sound or is not a primary means for sound transmission. Rather, holes 30 can be the primary means for sound transmission. The flexible sheet 34 can be substantially black. In some embodiments, the flexible sheet 34 is disposed between the display substrate 10 and the audio loudspeaker 36. In some embodiments of the present invention, a flexible sheet 34 flexes in response to sound and effectively transmits sound. Furthermore, a flexible sheet 34 can be made of a cloth, for example a cloth having a relatively open weave, through which air can readily pass, improving sound transmission and cooling of an iLED display 99.

The use of black materials can enhance the contrast of an iLED display 99 by absorbing stray light emitted by iLEDs 22 or absorbing ambient light. Display substrates 10 can also include black materials, coatings, or layers to improve contrast.

Holes 30 can be sized, shaped, or spaced to optimize audio throughput through a display substrate 10 and to reduce unwanted effects such as audio reflections and distortion, especially for mid-range frequencies important for understanding human speech or dialog found in films or movies, for example in a theater. For example, hole 30 edges can be rounded and the holes 30 substantially circular. Holes 30 can also have a size matched to the size of audio loudspeakers 36 (for example audio loudspeakers 36 having a diameter equal to or less than the diameter of a corresponding hole 30) and one or more of the audio loudspeakers 36 can be located directly behind or adjacent to the holes 30, so that sound emitted by the one or more of the audio loudspeakers 36 passes substantially (e.g., more than 25%, 50%, or 75%) through the holes 30. Likewise, in certain embodiments, microphones located behind a display substrate 10 can be disposed in or directly behind holes 30 to improve reception of audio signals through the display substrate 10 by the microphones and the microphones can have a size matched to the holes 30, for example having a size or diameter equal to or smaller than the holes 30.

Certain embodiments of the present invention comprise LED light-emitters, for example micro-iLEDs 22, that enable a relatively small aperture ratio, leaving space on the display substrate 10 or tile substrate 16 for the holes 30 through which sound can pass relatively unimpeded. In some embodiments, each iLED 22 of the plurality of iLEDs 22 has at least one of a width from 2 to 50 μm (e.g., 2 to 5 μm, 5 to 10 μm, 10 to 20 μm, or 20 to 50 μm), a length from 2 to 50 μm (e.g., 2 to 5 μm, 5 to 10 μm, 10 to 20 μm, or 20 to 50 μm), and a thickness from 2 to 50 μm (e.g., 2 to 5 μm, 5 to 10 μm, 10 to 20 μm, or 20 to 50 μm).

In various embodiments, the combined area of the light-emitting area of the iLEDs 22 or the iLEDs 22 themselves is less than or equal to 25%, 10%, 5%, 2%, 1%, 0.5%, 0.1%, 0.05%, or 0.01% of the minimum contiguous convex display area 12 including all of the iLEDs 22 on a display substrate 10. For example, micro-iLEDs 22 have been constructed having a size of 8×15 microns and area of 120 $\mu m^2$. For example, a 4k×2k full color display can have 4096×2048×3 iLEDs 22 (each having an area of 120 $\mu m^2$) equaling a total iLED 22 area of 3020 $mm^2$. An iLED display 99 having a display substrate 10 one meter high by two meters long has an area of two square meters or 2,000,000 $mm^2$, so that only 3020/2,000,000=0.15% of the display substrate 10 area is covered with the iLEDs 22. An exemplary 8k×4k display of the same size with same-sized iLEDs 22 will still have less than 1% of the display substrate 10 area covered by iLEDs 22.

Since, according to certain embodiments of the present invention, only a relatively small area of the display substrate 10 is covered with micro-iLEDs 22 and conductors 24, a relatively large portion of the display substrate 10 can be filled with holes 30. For example, the holes 30 in the display substrate 10 can cover more than or equal to 75%, 50%, 25%, 12.5%, 10%, 5%, 2%, or 1% of the minimum contiguous convex display area 12.

Figure 8:
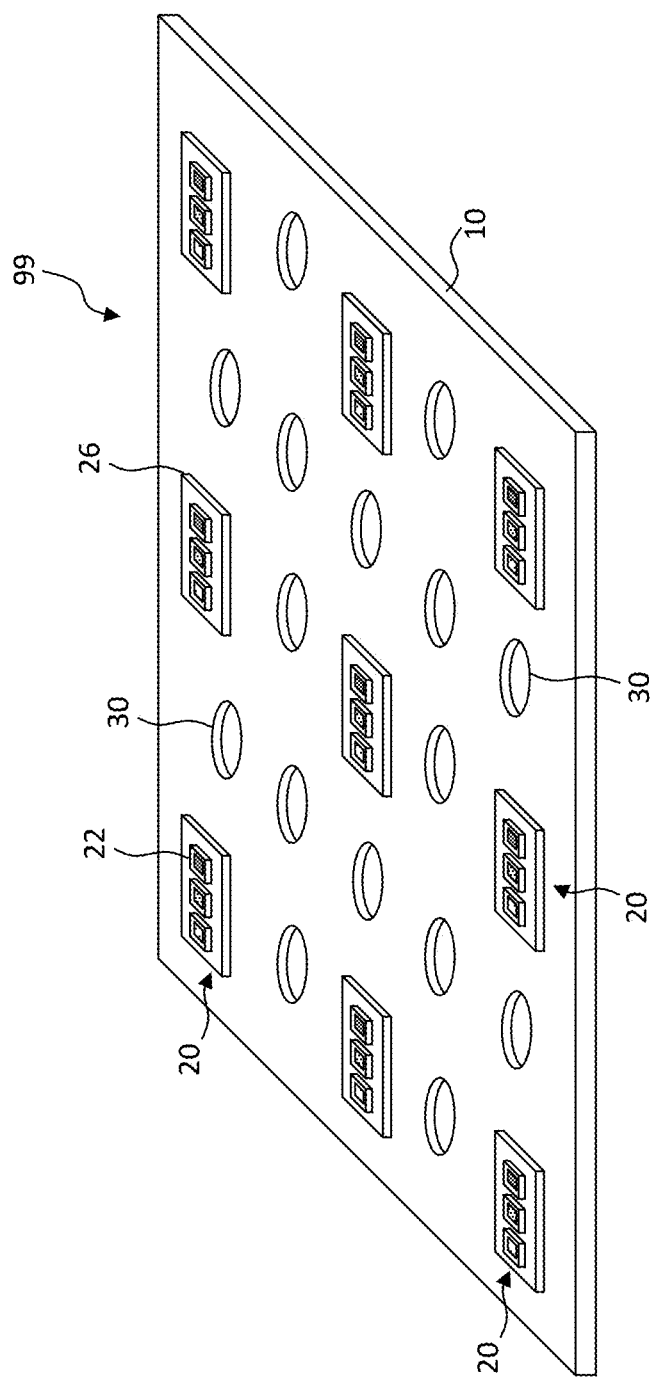
FIG. 8 is a perspective illustration of a display having pixel substrates, according to illustrative embodiments of the present invention.

In certain embodiments of the present invention, an iLED display 99 is a matrix-addressed iLED display 99 having row-select and column-data lines (e.g., conductors 24). Each iLED 22 is controlled by a row-select line in combination with a column-data line. In some embodiments, a passive-matrix control method is used to control the pixels 20 (and iLEDs 22 in each pixel 20) directly through the conductors 24, as illustrated in FIGS. 1-6. In some embodiments, iLEDs 22 are disposed directly on a display substrate 10 (e.g., as shown in FIG. 1). In some embodiments, iLEDs 22, for example iLEDs 22 in a pixel 20, are disposed and electrically connected directly on a pixel substrate 26 and the pixel substrates 26 are in turn disposed and electrically connected on a display substrate 10 (e.g., as shown in FIG. 8).

In some embodiments, referring to FIGS. 9, 10A, 10B, and 11, an iLED display 99 is an active-matrix display having a pixel controller 25 with a control circuit 27 provided for each pixel 20. The pixel controller 25 is disposed in, on, or over the display substrate 10 in association with one or more iLEDs 22 in the pixel 20 and is electrically connected (e.g., with conductors 24, not shown) to the one or more iLEDs 22 to control the one or more iLEDs 22 using signals provided on the conductors 24.

Figure 9:
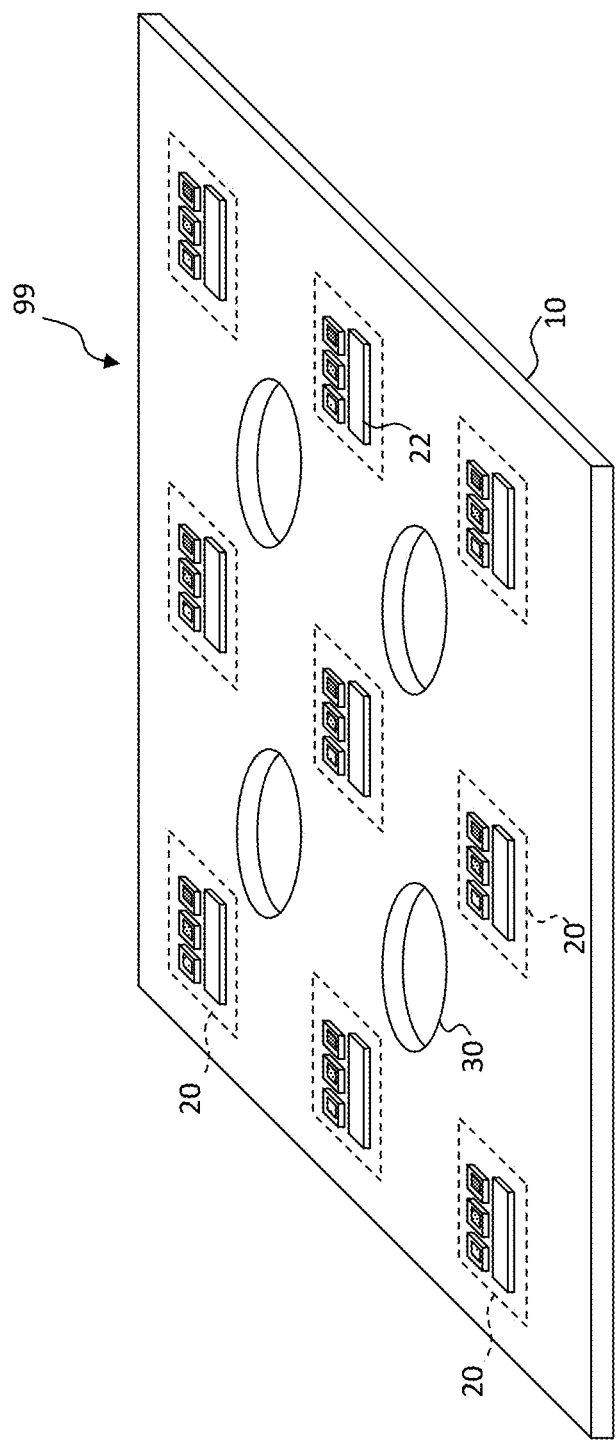
FIG. 9 is a perspective illustration of a display including pixels that each have a pixel controller, according to illustrative embodiments of the present invention.
Figure 10A:
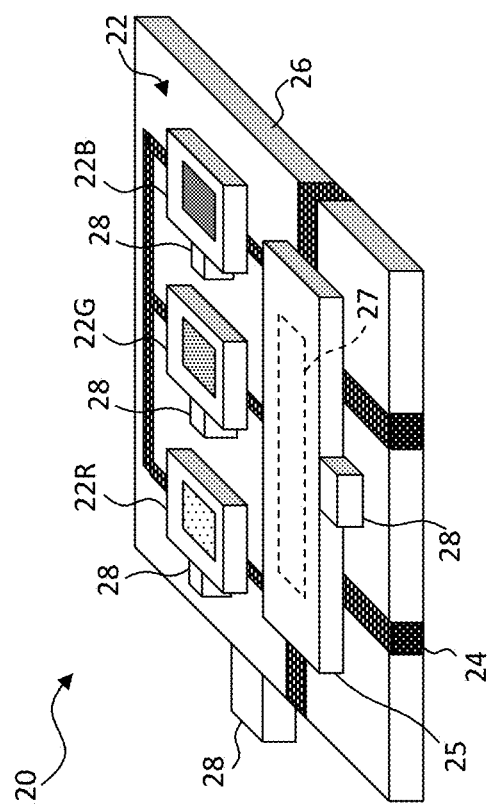
FIG. 10A is a perspective illustration of a pixel with a separate pixel controller and pixel substrate corresponding to FIG. 9, according to illustrative embodiments of the present invention.
Figure 10B:
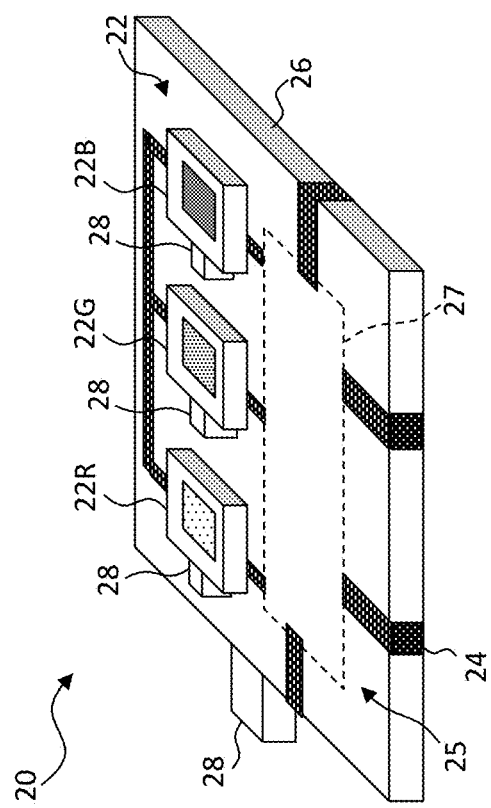
FIG. 10B is a perspective illustration of a pixel with a pixel control circuit formed in or on a pixel substrate, according to illustrative embodiments of the present invention.
Figure 11:
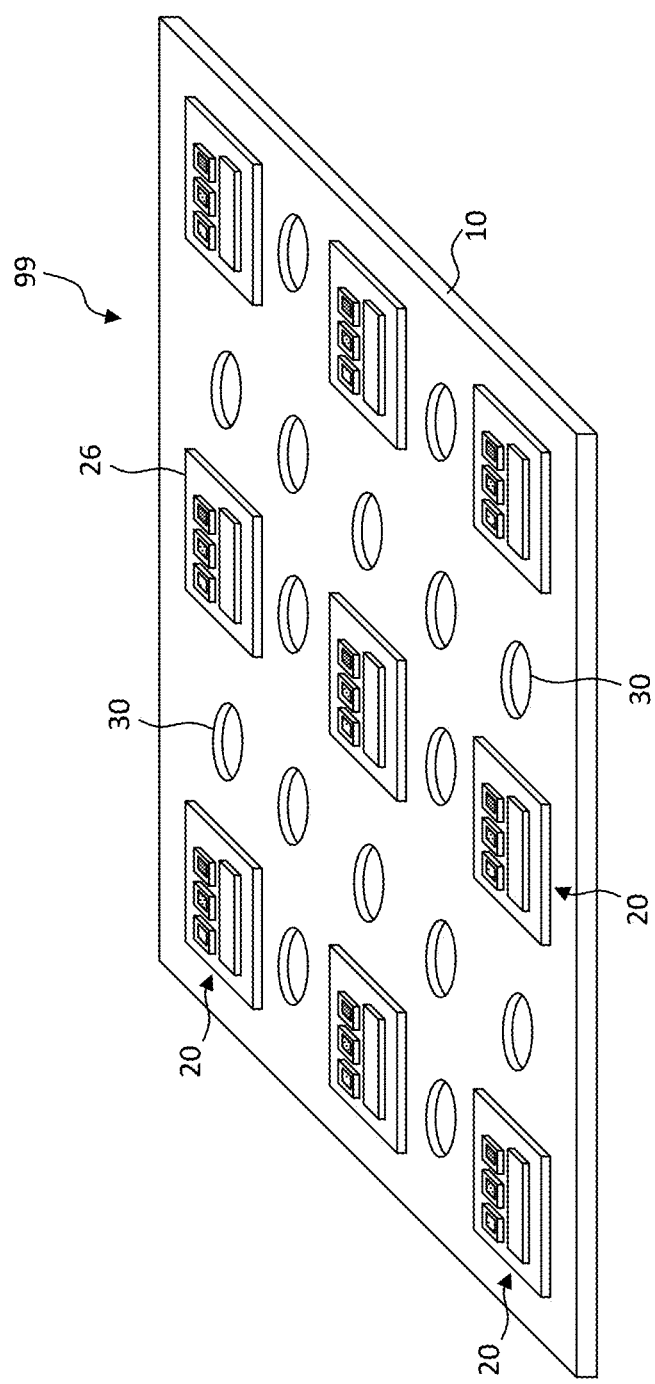
FIG. 11 is a perspective illustration of an illustrative embodiment of the present invention corresponding to FIG. 10A.

In some embodiments, iLEDs 22 and a pixel controller 25 are disposed directly on a display substrate 10 (e.g., as shown in FIG. 9). In some embodiments and as illustrated in FIGS. 10A, 10B, and 11, the components of a pixel 20, for example including a pixel controller 25 and iLED light emitters 22R, 22G, 22B are disposed on a pixel substrate 26 (e.g., as shown in FIG. 10A) and the pixel substrate 26 is disposed on a display substrate 10 (e.g., as shown in FIG. 11). In FIG. 10A, a pixel controller 25 is provided in a separate integrated circuit on a pixel substrate 26, for example micro-transfer printed from a native source wafer to the non-native pixel substrate 26 and electrically connected with fine, high-resolution electrical conductors 24. In FIG. 10B, the pixel substrate 26 is a semiconductor substrate and the pixel controller 25 is provided in a circuit formed in or on the pixel substrate 26, so that the pixel controller 25 is native to the pixel substrate 26, and electrically connected with fine, high-resolution electrical conductors 24.

Structures and elements in accordance with certain embodiments of the present invention can be made and assembled using micro-transfer printing methods and materials. In some embodiments, iLEDs 22 are prepared on a native source wafer, for example a sapphire wafer with compound semiconductors such as GaN thereon, each type of iLED 22 prepared on a different source wafer and released for micro-transfer printing with one or more tethers 28 (FIG. 10A shows one tether 28) physically connecting each iLED 22 to an anchor portion of the source wafer. Any pixel controller 25 provided in a separate integrated circuit, for example comprising silicon CMOS circuits, can similarly be prepared on a source wafer such as a silicon wafer. In certain embodiments, iLEDs 22 and any pixel controller 25 components are then contacted with a micro-transfer printing stamp (e.g., successively) to fracture or otherwise break the tethers 28 and adhere the components to the stamp, the stamp is transferred to a non-native destination substrate such as a display substrate 10, and the components are contacted and adhered to the destination substrate. A different micro-transfer printing step can be used with each different source wafer. When micro-transfer printing components directly from the source wafers to the destination substrate (e.g., display substrate 10), each micro-transfer printed component will have a substrate and form a fractured tether 28 such as that shown in FIGS. 10A, 10B.

If, in some embodiments, the components are first micro-transfer printed to non-native pixel substrates 26 (FIG. 10A), the pixel substrates 26 themselves can be, but are not necessarily, micro-transfer printed to a non-native destination substrate 10 using the same released structure with a tether 28 and micro-transfer printing process resulting in the display structure of FIG. 8 (without a pixel controller 25 in a passive-matrix configuration) or FIG. 11 (with a pixel controller 25 in an active-matrix configuration).

An iLED display 99 can have one of a variety of designs having a variety of resolutions, iLED 22 sizes, and display substrate 10 and display area 12 sizes. For example, display substrates 10 or tile substrates 16 ranging from 1 cm by 1 cm to 1 m by 1 m in size are contemplated. Inorganic light-emitting diodes 22 can be micro-iLEDs 22 and can have a size of one square micron to 500 square microns (e.g., at least one of a height, a length, and a width from 2 to 5 µm, 5 to 10 µm, 10 to 20 µm, or 20 to 50 µm). In general, larger iLEDs 22 are most useful with, but are not limited to, larger display substrates 10. The resolution of iLEDs 22 over a display substrate 10 can also vary, for example from 50 iLEDs 22 per inch to hundreds of iLEDs 22 per inch, or even thousands of iLEDs 22 per inch. For example, a three-color display having one thousand 10 µm×10 µm iLEDs 22 per inch (on a 25-micron pitch) has an aperture ratio of less than 16 percent (including only the iLEDs 22). Thus, certain embodiments of the present invention have application in both low-resolution and very high-resolution displays. An approximately one-inch 128 by 128 pixel display having 3.5 micron by 10-micron micro-iLED 22 emitters has been constructed and successfully operated as described in U.S. Patent Application Ser. No. 62/148,603 filed Apr. 16, 2015, entitled Micro Assembled Micro iLED displays and Lighting Elements. This iLED display has an aperture ratio (including only the iLEDs) of less than 1.0%.

According to certain embodiments of the present invention, a display substrate 10 can include layers formed on an underlying structure or substrate, for example a rigid or flexible glass or plastic substrate. In some embodiments, micro-iLEDs 22 are formed in a layer on a display substrate 10 so that the micro-iLEDs 22 are native to the display substrate 10. In some embodiments, micro-iLEDs 22 are transferred from another substrate (such as a semiconductor source wafer) to a display substrate 10 so that the micro-iLEDs 22 are non-native to the display substrate 10.

Referring to FIG. 1, the micro-iLEDs 22 are electrically connected to one or more electrical conductors 24 that electrically connect two or more of the pixels 20 and conduct power, a ground reference voltage, or signals for controlling the pixels 20 and the micro-iLEDs 22. In some embodiments, electrical conductors 24 are connected to a display controller that is external to a display substrate 10 (not shown). In some embodiments (not shown), the display controller is located on the display substrate 10 outside the display area 12. In certain embodiments, a display controller controls an iLED display 99 by, for example, providing power, a ground reference signal, and control signals. For clarity of illustration, the conductors 24 are omitted from the perspectives of FIGS. 8, 9, and 11.

As shown in the illustrative embodiments of FIGS. 1 and 9, pixels 20 can form a regular array on a display substrate 10. Each pixel 20 can include a single micro-iLED 22. As shown in FIG. 1, each pixel 20 can include at least three micro-iLEDs 22, wherein each of the at least three micro-iLEDs 22 emitting light of different colors, for example red, green, and blue. In some embodiments, at least some pixels 20 have an irregular arrangement on a display substrate 10 (not shown).

Referring to the perspectives of FIGS. 9-11, in certain embodiments of the present invention, each pixel 20 in the display area 12 of a display substrate 10 further includes a pixel controller 25. The pixel controller 25 is electrically connected to the one or more micro-iLEDs 22 (for example the red-light emitter 22R, the green-light emitter 22G, and the blue-light emitter 22B) to control the light output of the one or more micro-iLEDs 22, for example in response to control signals from a display controller through electrical conductors 24.

In some embodiments, a pixel controller 25 or micro-iLEDs 22 are formed in substrates or on supports separate from a display substrate 10 and disposed directly on the display substrate 10. For example, micro-iLEDs 22 and/or pixel controllers 25 are separately formed in a native semiconductor source wafer. The micro-iLEDs 22 or the pixel controller 25 are then removed from the wafer and transferred, for example using micro transfer printing, to the display substrate 10. This arrangement has the advantage of enabling use of a crystalline silicon substrate for the pixel controller 25 that provides, smaller higher-performance integrated circuit components than can be made in the amorphous or polysilicon semiconductor available on a large substrate such as the display substrate 10.

As shown in the perspectives of FIGS. 10 and 11, in some embodiments, micro-iLEDs 22 or pixel controllers 25 are located on or in a pixel substrate 26 smaller than and separate and distinct from a display substrate 10. Compound micro-assembly can be used to assemble micro-iLEDs 22 onto a pixel substrate 26 to form a pixel 20 and the pixel 20 is then micro-transfer printed or otherwise transferred to a display substrate 10. In some embodiments, other devices, for example pixel controllers 25, are also printed to pixel substrates 26 to form pixels 20.

In some embodiments, a display substrate 10 can include material, for example glass or plastic, different from a material in a semiconductor substrate (e.g., a pixel controller 25 substrate), for example a semiconductor material such as silicon or a compound semiconductor. As shown in FIGS. 10 and 11, pixels 20 or a pixel controller 25 can be located on a pixel substrate 26 with the pixel substrate 26 separately located on a display substrate 10. In some embodiments, a pixel controller 25 or micro-iLEDs 22 can be formed separately on separate semiconductor substrates (native source wafers), assembled onto a pixel substrate 26, and then the assembled unit is disposed on a surface of a display substrate 10. This arrangement has the advantage that the pixels 20 can be separately tested before they are located on the surface of the display substrate 10, thus improving yields and reducing costs.

In some embodiments of the present invention, micro-iLEDs 22 have light-emissive areas or a size of less than 10, 20, 50, or 100 square microns. In some embodiments, micro-iLEDs 22 have at least one of a height, a length, and a width from 2 to 50 μm (e.g., 2 to 5 μm, 5 to 10 μm, 10 to 20 μm, or 20 to 50 μm). Such micro-iLEDs 22 have the advantage of a small light-emissive area compared to their brightness as well as color purity providing highly saturated display colors and a substantially Lambertian emission providing a wide viewing angle for the iLED display 99 of the present invention. In various embodiments, the display area 12 of a display substrate 10 is greater than or equal to eight times, ten times, twenty times, fifty times, one hundred times, two hundred times, five hundred times, one thousand, or ten thousand times the combined light-emissive areas of the iLEDs 22 or the areas of the iLEDs 22.

Certain embodiments of the present invention can be operated in a variety of useful ways. In some embodiments, a display controller provides power, a ground reference, and control signals to pixels 20 in an iLED display 99 through electrical conductors 24. The signals can provide a passive-matrix control of the micro-iLEDs 22 in the pixels 20 to provide functionality to the iLED display 99. In some embodiments, pixels 20 include a pixel controller 25. A display controller is connected to the pixel controller 25 through electrical conductors 24 and provides control signals for operating the micro-iLEDs 22 in the pixels 20, for example in an active-matrix control configuration. In some embodiments, a pixel controller 25 includes analog, digital, or mixed-signal circuitry and can control micro-iLEDs 22 in response to a display controller to emit light in an image-wise fashion to provide a display, for example displaying images, graphics, text, or other information.

In methods according to certain embodiments of the present invention, a display substrate 10 is provided with holes 30. The display substrate 10 can be any conventional substrate such as glass, plastic, or metal or include such materials. The holes 30 can be made by etching, ablation, scribing and breaking, or molding, among various techniques. The display substrate 10 can be transparent, for example having a transmissivity greater than or equal to 50%, 80%, 90%, or 95% for visible light. A display substrate 10 usefully has two opposing smooth sides suitable for, for example, material deposition, photolithographic processing, or micro-transfer printing of micro-iLEDs 22. A display substrate 10 can have a size of a conventional display, for example a rectangle with a diagonal of a few centimeters to one or more meters and a thickness of at least 0.1 mm, 0.5 mm, 1 mm, 5 mm, 10 mm, or 20 mm. Such substrates are commercially available. Before, after, or at the same time as a display substrate 10 is provided, iLEDs 22 (e.g., micro-iLEDs 22) are provided, for example using photolithographic integrated circuit processes on semiconductor substrates. The micro-iLED semiconductor substrates are much smaller than and separate and distinct from the display substrate 10 or pixel substrates 26. Pixel substrates 26 can comprise material similar to material comprised in the display substrate 10.

Electrical conductors 24 can be formed on a display substrate 10 using photolithographic and display substrate 10 processing techniques, for example photolithographic processes employing metal or metal oxide deposition using evaporation or sputtering, curable resin coatings (e.g., SU8), positive or negative photo-resist coating, radiation (e.g., ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements.

Electrical conductors 24, or wires, can be fine interconnections, for example having a width of less than 50 microns, less than 20 microns, less than 10 microns, less than five microns, less than two microns, or less than one micron. In some embodiments, wires can include one or more crude lithography interconnections having a width from 2 μm to 2 mm, wherein each crude lithography interconnection is electrically connected to at least one of a plurality of pixels 20 on a display substrate 10. In some embodiments, fine interconnections are provided on pixel substrates 26 using relatively high-resolution photolithographic methods and materials and the coarse interconnections are provided on a display substrate 10 using relatively low-resolution printed circuit board methods and materials.

In some embodiments, iLEDs (e.g., micro-iLEDs 22) are transfer printed to a display substrate 10 in one or more transfers. For a discussion of micro-transfer printing techniques, see U.S. Pat. Nos. 8,722,458, 7,622,367 and 8,506,867, the disclosure of each of which is hereby incorporated by reference. In some embodiments, micro-iLEDs 22 are electrically connected to conductors 24 and display substrate contact pads 44 on a display substrate 10 by the process of micro-transfer printing, using connection posts formed with the micro-iLEDs 22, as described in U.S. Pat. No. 8,889,485. In certain embodiments, transferred micro-iLEDs 22 are interconnected to conductors 24 and display substrate contact pads 44 on a display substrate 10 using photolithographic or printed circuit board materials and methods, to enable a display controller to electrically interact with micro-iLEDs 22 to emit light in an iLED display 99. In some embodiments, transfer or construction of micro-iLEDs 22 is performed before or after all electrical conductors 24 are in place. Thus, in some embodiments, the construction of electrical conductors 24 can be performed before micro-iLEDs 22 are printed or after micro-iLEDs 22 are printed. In some embodiments, a display controller is externally located (for example on a separate printed circuit board substrate) and electrically connected to electrical conductors 24 using connectors, ribbon cables, or the like. In some embodiments, a display controller is affixed to a display substrate 10 outside the display area 12 and electrically connected to electrical conductors 24 using wires and buses, for example using surface mount and soldering technology (not shown).

Referring to FIGS. 9, 10A, 10B, and 11, in some embodiments, a pixel controller 25 is provided, for example using semiconductor integrated circuit processes. A pixel controller 25 can be provided at the same time as, before, or after micro-iLEDs 22, on separate semiconductor wafers, or on the same semiconductor wafer. Referring to FIG. 9, the micro-iLEDs 22 and the pixel controller 25 are transfer printed to the display substrate 10, either in a common transfer step or separate transfer steps from the same or different semiconductor wafers.

Referring to FIGS. 10A, 10B, and 11, the pixel substrate 26 is provided in addition to providing the display substrate 10, providing the micro-iLEDs 22, and providing the pixel controller 25. The pixel substrate 26 can, for example, be similar to the display substrate 10 (e.g. made of glass or plastic) but in a much smaller size, for example having an area of 50 square microns, 100 square microns, 500 square microns, or 1 square mm and can be only a few microns thick, for example 5 microns, 10 microns, 20 microns, or 50 microns. The iLEDs (e.g., micro-iLEDs 22) and, optionally, the pixel controller 25 (as shown in FIGS. 10A and 11) are transfer printed onto the pixel substrate 26 using one or more transfers from one or more semiconductor wafers to form a pixel 20 with a pixel substrate 26 separate from the display substrate 10, the substrate of the pixel controller 25, and the substrates of the micro-iLEDs 22. In some embodiments, as illustrated in FIG. 10B, a pixel substrate 26 includes a semiconductor and micro-iLEDs 22 or a pixel controller 25 and, optionally, some electrical conductors 24, are formed in the pixel substrate 26 to electrically interconnect the micro-iLEDs 22 and the control circuit 27, for example using photolithographic processes and fine interconnections. Optionally, the pixels 20 on the pixel substrates 26 are tested and accepted, repaired, or discarded. The pixels 20 are transfer printed or otherwise assembled onto the display substrate 10 and then electrically interconnected to contact pads 44 on the display substrate 10 for connection to the display controller.

Referring to FIG. 13, in some embodiments of the present invention, holes 30 are located on a tile substrate edge 18 and, in certain embodiments, can be aligned to form larger holes 30 in and between the tile substrates 16. In some such embodiments, an iLED display 99 comprises a plurality of display substrates 10 or tile substrates 16 disposed in a common plane or on a common surface. Each tile substrate 16 comprises a display area 12 and one or more tile substrate edges 18. A tile substrate edge 18 of each tile substrate 16 is disposed adjacent to a tile substrate edge 18 of another tile substrate 16. A plurality of inorganic light-emitting diodes (e.g., micro-iLEDs 22) is disposed on, in, or over each tile substrate 16 in an array (e.g., a regular array) in the display area 12 and one or more holes 30 extend through one or more tile substrate 16 at the tile substrate edge 18. For example, a hole 30 that is a notch or indentation on one tile substrate edge 18 of a tile substrate 16 may be adjacent (e.g., abutted, in contact) with a tile substrate edge 18 of another tile substrate 16 that does not have a notch or indentation. In some embodiments, two adjacent tile substrate 16 having adjacent tile substrate edges 18 each have a hole 30 (e.g., notch or indentation) extending through the tile substrate 16 at the tile substrate edge 18 and the holes 30 of the adjacent tile substrate 16 overlap to form a larger hole 30.

In the context of a tiled iLED display 99, a hole 30 on or in the tile substrate edge 18 can be a notch or other indentation in the tile substrate 16 that extends through the tile substrate 16. In certain embodiments, when two or more tiles 14 are abutted, the notch or indentation forms a contiguous hole 30 that is completely surrounded by the tile substrates 16 of the two or more abutted tiles 14. If both tile substrates 16 have adjoining, adjacent, or in contact holes 30 (e.g., notches or indentations), the resulting hole 30 is the combination of the holes 30 (notches or indentations) of the adjoining holes 30 of each the two or more tiles 14 and is larger than the hole 30 (notch or other indentation) in each individual tile substrate edge 18. The holes 30 in the tile substrate edges 18 of the two or more tiles can be on a corner of the tiles 14.

Methods of forming micro-transfer printable structures are described, for example, in the paper "AMOLED Displays using Transfer-Printed Integrated Circuits" (Journal of the Society for Information Display, 2011, DOI #10.1889/ JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, the disclosure of each of which is hereby incorporated by reference in its entirety. Micro-transfer printing using compound microassembly structures and methods can also be used with certain embodiments of the present invention, for example, as described in U.S. patent application Ser. No. 14/822,868, filed Aug. 10, 2015, entitled Compound Micro Assembly Strategies and Devices, the disclosure of which is hereby incorporated by reference in its entirety. Additional details useful in understanding and performing aspects of the present invention are described in U.S. patent application Ser. No. 14/743,981, filed Jun. 18, 2015, entitled Micro Assembled iLED displays and Lighting Elements, the disclosure of which is hereby incorporated by reference in its entirety.

By employing the multi-step transfer, test, or assembly process of FIGS. 10A, 10B, and 11, increased yields can be achieved and thus reduced costs for certain embodiments of the present invention.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Furthermore, the designations of "row" or "column" with respect to matrix addressing are arbitrary and can be exchanged.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 display substrate
12 minimum contiguous convex display area
14 tile
16 tile substrate
18 tile substrate edge
20 pixel
22 inorganic light-emitting diode/micro-iLED
22R red-light emitter
22G green-light emitter
22B blue-light emitter
24 conductor
25 pixel controller
26 pixel substrate
27 control circuit
28 tether
30 hole
32 foam
34 flexible sheet
36 audio loudspeaker
40 iLED contact pad
42 electrode
44 display substrate contact pad
46 dielectric
48 reflective layer
60 light
70 row- or column-control circuit
80 via
99 inorganic light-emitting diode (iLED) display

What is claimed:

1. An inorganic light-emitting diode (iLED) display, comprising:
    a display substrate having a display area and a shape defining open holes extending through the display substrate in the display area, wherein air can flow through the display substrate via the open holes; and
    a plurality of inorganic light-emitting diodes (iLEDs) disposed on, in, or over the display substrate in an array in the display area,
    wherein at least some of the iLEDs are disposed between at least some of the open holes in the display area and at least some of the open holes are between at least some of the iLEDs in the display area,
    wherein the plurality of iLEDs are operable to emit light from the display and air moves through the open holes when the plurality of iLEDs are operating to emit light from the display.

2. The iLED display of claim 1, wherein the iLEDs emit light through the display substrate.

3. The iLED display of claim 1, wherein the iLEDs emit light in a direction away from the display substrate.

4. The iLED display of claim 1, wherein the open holes are at least partially unfilled.

5. The iLED display of claim 1, comprising one or more audio loudspeakers disposed adjacent to the display substrate and disposed to emit sound through the open holes in the display substrate.

6. The iLED display of claim 1, wherein the display substrate is substantially rigid and comprising a flexible sheet laminated, affixed, or adjacent to the display substrate.

7. The iLED display of claim 6, wherein the flexible sheet is substantially black.

8. The iLED display of claim 7, comprising one or more audio loudspeakers disposed adjacent to the flexible sheet with the flexible sheet disposed between the display substrate and the one or more audio loudspeakers.

9. The iLED display of claim 1, wherein an area of a convex hull enclosing the plurality of iLEDs on the display substrate define the display area of the display substrate and wherein the combined area of the iLEDs is less than or equal to 25% of the display area.

10. The iLED display of claim 1, wherein an area of a convex hull enclosing the plurality of iLEDs on the display substrate define the display area of the display substrate and wherein the open holes cover more than or equal to 1% of the display area.

11. The iLED display of claim 1, wherein an area of a convex hull enclosing the plurality of iLEDs on the display substrate define the display area of the display substrate and wherein the open holes form a regular array in the display area.

12. The iLED display of claim 1, comprising two or more electrical conductors disposed on or over the display substrate and between the open holes, each iLED electrically connected to two or more electrical conductors.

13. The iLED display of claim 1, wherein the iLED display is a matrix-addressed display comprising row-select and column-data lines, and each iLED is controlled by a row-select line in combination with a column-data line.

14. The iLED display of claim 13, wherein the iLED display is an active-matrix display and comprises a controller disposed in, on, or over the display substrate in association with one or more iLEDs of the plurality of iLEDs and electrically connected to the one or more iLEDs to control the one or more iLEDs using signals provided by the row-select line and column-data line.

15. The iLED display of claim 1, comprising a plurality of pixels, each pixel comprising one or more iLEDs of the plurality of iLEDs and a pixel substrate on which the one or more iLEDs are disposed, each pixel substrate disposed on the display substrate within the display area.

16. The iLED display of claim 15, wherein each pixel substrate comprises a broken or separated tether.

17. The iLED display of claim 1, wherein each iLED of the plurality of iLEDs has a broken or separated tether.

18. The iLED display of claim 1, wherein each iLED of the plurality of iLEDs has at least one of a width from 2 to 50 μm, a length from 2 to 50 μm, and a thickness from 2 to 50 μm.

19. The iLED display of claim 1, comprising a plurality of holes between adjacent iLEDs of the plurality of iLEDs, between adjacent pixels, or within an area bounded by pixels that does not include any other pixels, in one or two dimensions parallel to a surface of the display substrate.

20. The iLED display of claim 1, wherein the array is a regular array.

21. An inorganic light-emitting diode (iLED) display, comprising:
    a frame;
    a plurality of tile substrates mounted in the frame, the tile substrates disposed in a common plane or on a common surface, each tile substrate of the plurality of tile substrates comprising a display area and one or more tile substrate edges, and wherein a tile substrate edge of each tile substrate is disposed adjacent to a tile substrate edge of another tile substrate; and a plurality of inorganic light-emitting diodes (iLEDs) disposed on, in, or over each tile substrate of the plurality of tile substrates in an array in the display area, wherein at least one tile substrate of the plurality of tile substrates has a shape that defines one or more holes extending through the at least one tile substrate at the tile substrate edge, wherein air can flow through the at least one tile substrate via the one or more holes while the iLEDs are emitting light.

22. The iLED display of claim 21, wherein the array is a regular array.

23. An inorganic light-emitting diode (iLED) display, comprising:
a plurality of tile substrates disposed in a common plane or on a common surface, each tile substrate of the plurality of tile substrates comprising a display area and one or more tile substrate edges, and wherein a tile substrate edge of each tile substrate is disposed adjacent to a tile substrate edge of another tile substrate;
a plurality of inorganic light-emitting diodes (iLEDs) disposed on, in, or over each tile substrate of the plurality of tile substrates in an array in the display area; and
at least one tile substrate of the plurality of tile substrates has a shape that defines one or more holes extending through the at least one tile substrate at the adjacent tile substrate edge of the at least one tile substrate of the plurality of tile substrates,
wherein two adjacent tile substrates of the plurality of tile substrates having adjacent display substrate edges each have shape that defines at least one hole extending through the tile substrate at the display substrate edge and wherein at least one of the at least one hole of each of the adjacent tile substrates overlap to form a larger hole.

24. An inorganic light-emitting diode (iLED) display, comprising:
a display substrate having a display area and a shape defining holes extending through the display substrate in the display area;
a plurality of inorganic light-emitting diodes (iLEDs) disposed on, in, or over the display substrate in an array in the display area; and
wherein at least some of the iLEDs are disposed between at least some of the holes in the display area and at least some of the holes are between at least some of the iLEDs in the display area,
and wherein one hole of the holes is disposed between each pair of adjacent pixels in one or two dimensions parallel to a surface of the display substrate, each of the adjacent pixels comprising one or more of the iLEDs.

25. An inorganic light-emitting diode (iLED) display, comprising:
a display substrate having a display area and a shape defining holes extending through the display substrate in the display area, wherein air can flow through the display substrate via the holes and foam is disposed in the holes; and
a plurality of inorganic light-emitting diodes (iLEDs) disposed on, in, or over the display substrate in an array in the display area,
wherein at least some of the iLEDs are disposed between at least some of the holes in the display area and at least some of the holes are between at least some of the iLEDs in the display area.

26. The iLED display of claim 25, wherein the foam is substantially black.

27. An inorganic light-emitting diode (iLED) display, comprising:
a frame;
a plurality of tiles mounted in the frame, each of the plurality of tiles comprising a tile substrate comprising a display area and having a shape defining one or more holes extending through the tile substrate in the display area; and
a plurality of inorganic light-emitting diodes (iLEDs) disposed on, in, or over the tile substrate for each of the plurality of tiles,
wherein at least some of the iLEDs of the tiles are disposed between at least some of the holes of the tiles and at least some of the holes of the tiles are between at least some of the iLEDs of the tiles.

28. An inorganic light-emitting diode (iLED) display, comprising:
a display substrate having a display area and a shape defining holes extending through the display substrate in the display area, wherein air can flow through the display substrate via the holes; and
a plurality of inorganic light-emitting diodes (iLEDs) disposed on, in, or over the display substrate in an array in the display area,
wherein at least some of the iLEDs are disposed between at least some of the holes in the display area and at least some of the holes are between at least some of the iLEDs in the display area,
wherein the plurality of iLEDs are operable to emit light from the display, and
wherein an area of a convex hull enclosing the plurality of iLEDs on the display substrate defines the display area of the display substrate and the holes cover more than or equal to 25% of the display area.

* * * * *